United States Patent
Feng et al.

(10) Patent No.: US 7,772,879 B1
(45) Date of Patent: Aug. 10, 2010

(54) LOGIC MODULE INCLUDING VERSATILE ADDER FOR FPGA

(75) Inventors: Wenyi Feng, Sunnyvale, CA (US); Jonathan Greene, Palo Alto, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 12/101,589

(22) Filed: Apr. 11, 2008

Related U.S. Application Data

(60) Provisional application No. 60/911,251, filed on Apr. 11, 2007.

(51) Int. Cl.
*G06F 7/38* (2006.01)
*H03K 19/173* (2006.01)

(52) U.S. Cl. .......................................... 326/38; 716/16
(58) Field of Classification Search ............. 326/37–41, 326/47; 716/16
See application file for complete search history.

(56) References Cited

U.S. PATENT DOCUMENTS

| | | | |
|---|---|---|---|
| 3,728,532 A | 4/1973 | Pryor | |
| 5,349,250 A | 9/1994 | New | |
| 5,481,206 A * | 1/1996 | New et al. | 326/38 |
| 5,724,276 A | 3/1998 | Rose et al. | |
| 5,818,255 A | 10/1998 | New et al. | |
| 6,157,209 A * | 12/2000 | McGettigan | 326/39 |
| 6,288,570 B1 | 9/2001 | New | |
| 6,708,191 B2 * | 3/2004 | Chapman et al. | 708/235 |
| 6,873,181 B1 | 3/2005 | Pedersen | |
| 7,016,932 B2 | 3/2006 | Kantabutra et al. | |
| 7,129,748 B1 | 10/2006 | McCollum et al. | |
| 7,185,035 B1 | 2/2007 | Lewis et al. | |
| 7,218,139 B1 | 5/2007 | Young et al. | |
| 2003/0001613 A1 * | 1/2003 | Nakaya | 326/38 |

OTHER PUBLICATIONS

Actel Axcelerator Family FPGAs, Detailed Specifications (v2.6) http://www.actel.com/documents/AXDetailedSpecs_DS.pdf, pp. 2-43 through 2-46, Mountain View, CA, USA.

Cyclone Architecture, Cyclone Device Handbook, vol. 1, C51002-1. 5, [Internet] http://www.altera.com/literature/hb/cyc/cyc_c51002. pdf, Altera Corp., Jan. 2007, pp. 2-1, 2-10, Fig. 2-7, San Jose, CA, USA.

(Continued)

*Primary Examiner*—Rexford N Barnie
*Assistant Examiner*—Dylan White
(74) *Attorney, Agent, or Firm*—Lewis and Roca LLP

(57) ABSTRACT

A logic module for an FPGA includes a LUT formed from an N-level tree of 2:1 multiplexers. Each of the N inputs to the LUT is connected to the select inputs of the multiplexers in one level of the tree. Each of the data inputs at the leaves of the tree is driven by a configuration memory cell that produces either a logic 0 or a logic 1. The output of the single multiplexer at the last level of the tree forms a Y output and is coupled to one input of an XOR gate and to the select input of a two-input carry multiplexer. The 0 input of the carry multiplexer is coupled to a G input. A CI input is coupled to the other input of the XOR gate and to the 1 input of the carry multiplexer.

10 Claims, 12 Drawing Sheets

OTHER PUBLICATIONS

Cyclone II Architecture, Cyclone II Device Handbook, vol. 1, CII51002-3.1, [Internet] http://www.altera.com/literature/hb/cyc2/cyc2_cii51002.pdf, Altera Corp., Feb. 2007, p. 2-1, p. 2-6, Fig. 2-4, San Jose, CA, USA.

"Logic Elements and Logic Array Blocks in Cyclone III Devices," Cyclone III Device Handbook, vol. 1, CIII51002-1.1, [Internet] http://www.altera.com/literature/hb/cyc3/cyc3_ciii51002.pdf, Altera Corp., Jul. 2007, pp. 2-1, 2-2, 2-4 to 2-6, San Jose, CA.

Stratix Architecture, S51002-3.2, Stratix Device Handbook, vol. 1, [Internet] http://www.altera.com/literature/hb/stx/ch_2_vol_1.pdf, Altera Corp., Jul. 2005, p. 2-1, p. 2-11, Fig. 2-7, San Jose, CA, USA.

Stratix II Architecture, SII51002-4.3, [Internet] http://www.altera.com/literature/hb/stx2/stx2_sii51002.pdf,, Altera Corp, May 2007, pp. 2-1, 2-14 to 2-19, Figs. 2-10, 2-11, 2-12, 2-13, 2-14, San Jose, CA, USA.

"Logic Array Blocks and Adaptive Logic Modules in Stratix III Devices," Stratix III Device Handbook, vol. 1, http://www.altera.com/literature/hb/stx3/stx3_siii51002.pdf, Oct. 2007, pp. 2-1, 2-13 to 2-19, Figs. 2-10, 2-11, 2-12, 2-13, 2-14, San Jose, CA.

Cormen, Thomas H. et al., "Introduction to Algorithms," 1990, pp. Cover pages, 662-663, The MIT Press and McGraw-Hill Book Co.

Filo, David et al., "Technology Mapping for a Two-Output RAM-Based Field Programmable Gate Array", European Design Automation Conf. (EDAC) 1991, p. 534-538, IEEE Computer Society Press, Los Alamitos, CA, USA.

"Lattice LatticeSC/M Family Data Sheet, DS1004 Version 01.7," Lattice Semiconductor Corp., http://www.latticesemi.com/documents/DS1004.pdf, Aug. 2007, pp. 2-1, 2-3 through 2-6, Hillsboro, OR, USA.

Ling, Huey, "High-Speed Binary Adder," IBM J. Res. Develop., vol. 25, No. 3, May 1981, pp. 156-166.

Virtex 2.5 V Field Programmable Gate Arrays, Xilinx Data Book 1999, Xilinix® Corporation, Feb. 16, 1999 (Version 1.3), pp. 3-8 & 3-9, San Jose, CA, USA.

Virtex -E 1.8 V Extended Memory Field Programmable Gate Arrays, DS025-2 (v2.2), Module 2 of 4, [Internet] http://www.xilinx.com/support/documentation/data_sheets/ds025-2.pdf, Xilinx, Inc., Sep. 10, 2002, pp. 1&4, Figs 4&5, San Jose, CA, USA.

Virtex-II Platform FPGAs: Complete Data Sheet, DS031 (v3.5), Module 2 of 4, [Internet] http://www.xilinx.com/support/documentation/data_sheets/ds031.pdf, Xilinx, Inc., Nov. 5, 2007, pp. 1 & 13, Fig. 16, , San Jose, CA, USA.

Virtex-4 FPGA User Guide, UG070 (v2.4), [Internet] http://www.xilinx.com/support/documentation/user_guides/ug070.pdf, Xilinx, Inc., Apr. 10, 2008, pp. Cover page & p. 185, Fig. 5-2, San Jose, CA, USA.

Virtex-5 User Guide, UG190 (v3.1) Sep. 11, 2007, http://www.xilinx.com/support/documentation/user_guides/ug190.pd, pp. Cover, 168-170, San Jose, CA, USA.

Virtex-5 FPGA User Guide, UG190 (v4.1), http://www.xilinx.com/support/documentation/user_guides/ug190.pd, Xilinx, Inc., Apr. 25, 2008, pp. Cover, 173, Fig. 5-3, San Jose, CA, USA.

"Spartan and SpartanXL Families Field Programmable Gate Arrays," Xilinx Data Book 1999, Xilinx® Corporation, Jan. 6, 1999 (Version 1.4), pp. 4-18, 4-19, & 4-20, San Jose, CA, USA.

\* cited by examiner

LOGIC MODULE INCLUDING VERSATILE ADDER FOR FPGA

CROSS-REFERENCE TO RELATED APPLICATION

This application claims an invention which was disclosed in Provisional Application No. 60/911,251, filed Apr. 11, 2007, entitled "LOGIC MODULE INCLUDING VERSATILE ADDER FOR FPGA." The benefit under 35 USC §119 (e) of the United States provisional application is hereby claimed, and the aforementioned provisional application is hereby incorporated herein by reference.

BACKGROUND OF THE INVENTION

1. Field of the Invention

The present invention relates to field-programmable gate array (FPGA) integrated circuits. More particularly, the present invention relates to a versatile adder circuit for an FPGA.

2. The Prior Art

Adder circuits are known in the prior art. Numerous adder circuits have been developed for use in FPGA applications. FIGS. 1 through 3 present functional diagrams of some of the prior art circuits used to provide hardware support for arithmetic in FPGAs.

FIG. 1 is a block diagram of a carry chain employed in the AX series of FPGA products from Actel Corporation of Mountain View, Calif. This circuit uses a 2-bit look-ahead scheme, and two dedicated XOR gates per bit.

FIG. 2 shows a logic module using another scheme from the prior art. A, B, C, and D are inputs from the routing fabric. F is a 4-input lookup table (LUT), which can be configured to compute any function of its inputs. Two of the multiplexers are configuration multiplexers whose select inputs (omitted for clarity) are controlled by flash, SRAM, or other configuration memory bits. CI is the carry input from the previous logic module in a carry chain, and CO is the carry output to the next logic module in the chain. F is a 4-input LUT having an output Y that is used for normal (non-arithmetic) computations. S is the sum output used in arithmetic mode (when the carry chain is used). The AND gate is necessary to implement computing functions such as a one-bit adder where each addend is the logical AND of two inputs.

FIG. 3 is a block diagram showing another example of a logic module from the prior art. F0 and F1 are two 3-input LUTs. CI shares the B input of both F0 and F1, so the B input cannot be used in arithmetic mode. For a straightforward circuit implementation, the delay from CI to CO can be substantial.

When the carry out (CO) signal is produced by a 2:1 multiplexer from inputs P, G, and CI as in the implementations shown in FIGS. 1 and 2, the prior-art circuits employ either a logic module input or the AND of two inputs as the source of the G signal.

BRIEF DESCRIPTION OF THE INVENTION

A logic module for an FPGA includes a LUT formed from an N-level tree of 2:1 multiplexers. Each of the N inputs to the LUT is connected to the select inputs of the multiplexers in one level of the tree. As used in this disclosure, unless the context dictates otherwise, the "first" level of a tree is the "bottom" or "trunk" level, the output of which is the output of the entire tree. As the tree is parsed "upward" toward the input stage of the tree, the levels increase (i.e., second, third, fourth ... Nth level). Each of the data inputs at the leaves (top) of the tree is driven by a configuration memory cell that produces either a logic 0 or a logic 1. The output of the single multiplexer at the trunk (bottom) level of the tree forms a Y output and is coupled to one input of an XOR gate and to the select input of a two-input carry multiplexer. The 0 input of the carry multiplexer is coupled to a G input. A CI input is coupled to the other input of the XOR gate and to the 1 input of the carry multiplexer.

One aspect of the present invention is that an internal signal of the LUT may be "tapped" to provide a source for the input "G."

According to another aspect of the present invention, the XOR gate may be replaced by a multiplexer that drives the A input of the first level of the tree.

According to yet another aspect of the present invention, higher order inputs are presented to two LUTs and the A input drives the select input of a first multiplexer that selects between the outputs of the two LUTs. The output of the first multiplexer drives one input of an XOR gate. The other input of the XOR gate is driven by a CI input. A carry multiplexer has one data input driven by the CI input and another data input driven by the output of a second multiplexer that selects between the outputs of the two LUTs, a logic 0 and a logic 1. The select input of the carry multiplexer is driven by the output of a third multiplexer that selects between the output of the first multiplexer and a logic 0. The select inputs of the second and third multiplexers are driven from FPGA configuration circuitry.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

The present invention provides a generic logic cell for use in an FPGA that can efficiently and flexibly implement arithmetic and related functions with a minimum of added circuitry, power and delay.

Figure 4A:
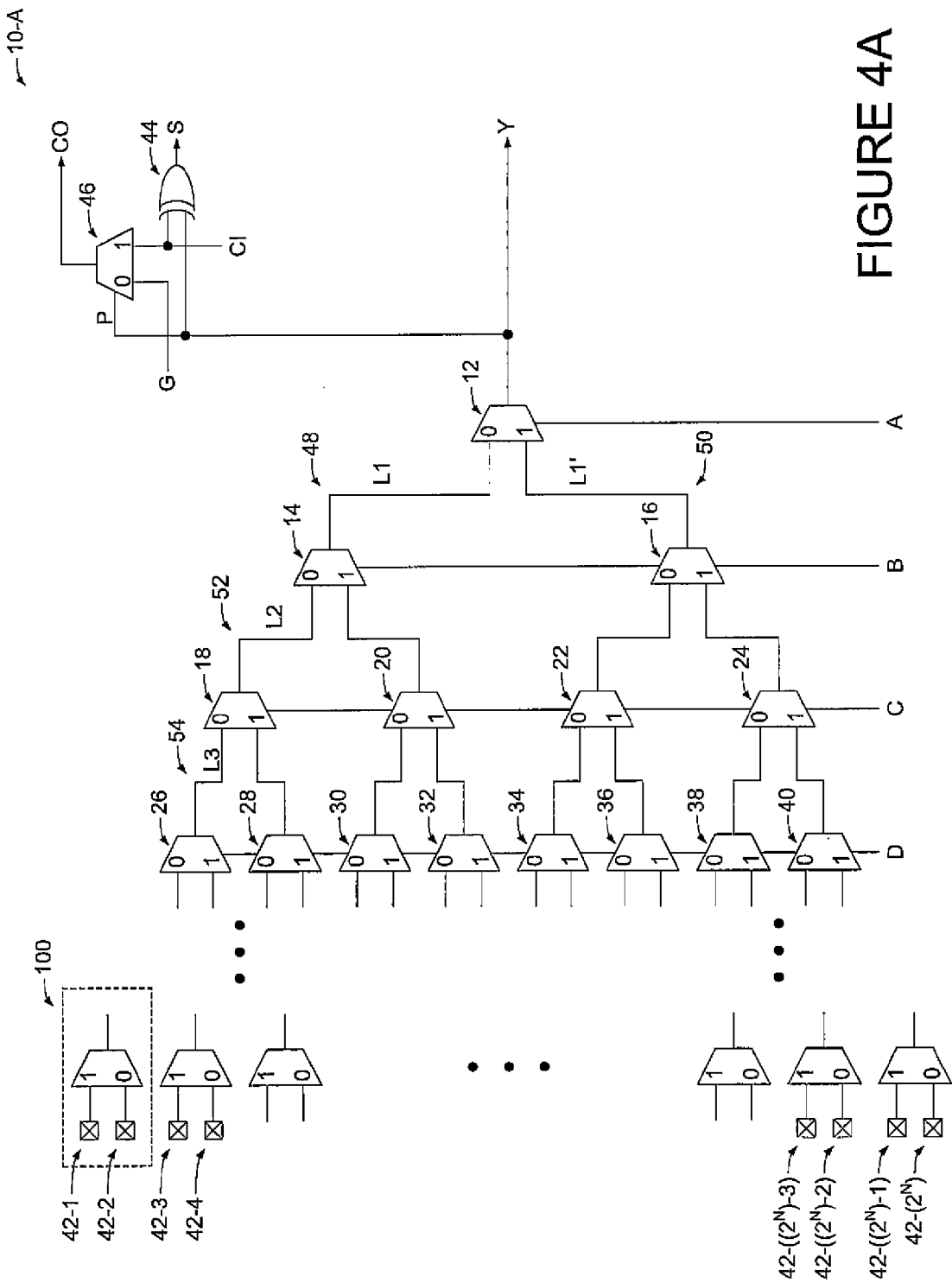
FIG. 4A is a block diagram showing a logic module employing an adder circuit according to the present invention.

Referring now to FIG. 4A, a block diagram of a logic module 10-A according to the present invention shows the last four layers of an N-input LUT, realized as an N-level tree of 2:1 multiplexers. Each of the N inputs to the LUT is connected to the select inputs of the multiplexers in one level of the tree. The outputs of the multiplexers in each level of the tree are connected in pairs to the inputs of the multiplexers in the next level of the tree. Each of the data inputs at the leaves of the tree is driven by a configuration memory cell that produces either a logic 0 or a logic 1.

As shown in FIG. 4A, the first level ("level one") of the LUT includes a single multiplexer 12 having its select input coupled to the "A" input of the LUT. The data inputs of the single multiplexer 12 are coupled to the outputs of multiplexers 14 and 16 that form the second level of the LUT. The select inputs of multiplexers 14 and 16 are coupled to the "B" input of the LUT. The data inputs of multiplexers 14 and 16 are coupled to the outputs of multiplexers 18, 20, 22, and 24 that form the third level of the LUT. The select inputs of multiplexers 18, 20, 22, and 24 are coupled to the "C" input of the LUT. The data inputs of multiplexers 18, 20, 22, and 24 are coupled to the outputs of multiplexers 26, 28, 30, 32, 34, 36, 38, and 40 that form the fourth level of the LUT. The select inputs of multiplexers 26, 28, 30, 32, 34, 36, 38, and 40 are coupled to the "D" input of the LUT. It thus may be seen that each level n (n=1 ... N) of the LUT includes $2^{(n-1)}$ multiplexers. Any successive levels of the LUT each include $2^{(n-1)}$ multiplexers that are configured similarly to the multiplexers shown in FIG. 4A.

As shown in the dashed box 100 of FIG. 4A, the inputs of the multiplexers in the Nth level of the LUT are each connected to the output of a memory cell, which may be, for example, a volatile memory cell such as an SRAM cell or a non-volatile memory cell such as a flash cell. Such memory cells are shown at reference numerals 42-1 though $42\text{-}2^N$ in FIG. 4. In other embodiments, the structure shown in the dashed box 100 may be replaced by the non-volatile cell shown in the dashed box 101 shown in FIG. 5. Cell 101 includes four non-volatile transistors. One terminal of each transistor is connected to an input signal (0, 1, D, or not(D)) and the other terminal of each transistor is coupled to an output node for the cell. Embodiments using cell 101 allow for the elimination of the top level of multiplexers in the LUT tree of the logic module 10-A, so that a logic module 10-A with N signal inputs has N−1 levels of multiplexers in its LUT tree. Other examples of cells that can be used as the inputs to a logic module 10-A are disclosed in U.S. Pat. No. 7,129,748, which is hereby incorporated by reference.

The output of multiplexer 12 forms the output "Y" of logic module 10-A. The output of multiplexer 12 is also coupled to one input of XOR gate 44. As used in this disclosure "XOR gate" means a logic circuit performing a logical exclusive-OR function, or any circuit or combination of circuits performing a logically equivalent function. The other input of XOR gate 44 is coupled to the carry-in (CI) input of logic module 10-A. The output of XOR gate 44 forms the sum output "S" of logic module 10-A.

The CI input of logic module 10-A is also coupled to one data input of carry multiplexer 46. The other data input of carry multiplexer 46 is coupled to the "G" input of logic module 10-A. The select input of carry multiplexer 46 is coupled to the output of multiplexer 12. The output of carry multiplexer 46 forms the carry-out (CO) output of logic module 10-A.

The logic module shown in FIG. 4A is versatile. As an example, if it is desired that the LUT compute the AND function of its N inputs, the bottom memory cell $42\text{-}2^N$ (whose value is selected when all N LUT inputs are at logic 1 to implement the AND function) is configured to output a logic 1, and all other memory cells are configured to output a logic 0.

One aspect of the present invention is that an internal signal of the LUT may be "tapped" to provide a better source for the input "G." This provides additional flexibility with negligible extra hardware. The taps may be hardwired or selectable using switching elements such as multiplexers as exemplified by multiplexer 56 shown in FIGS. 4B, 4C, 4D and 4E. In the embodiment shown in FIG. 4A, signal P is a propagation signal such that if P is 1, CI is propagated forward as the carry output.

There are many possible choices for the internal signal to be tapped. In principal, the tap points can be anywhere in the LUT tree. A tap point can be described using a vector (V_A, V_B, ... ). The number of fields in the vector is equal to the level of the multiplexer where the tap point drives. The value of the fields describe how to parse the tree, starting at the bottom (trunk) of the tree at multiplexer 12 to traverse the branches to reach a tap point to connect the relevant multiplexer output to input G.

The following examples are based on FIG. 4A. To describe a tap point at the inputs of the first (trunk) level multiplexer:

L1 (48): the tap point is (V_A=0); number of fields is 1, from LUT tree to L1 go to the 0-input leg of the first level multiplexer. L1' (50): the tap point is (V_A=1).

To describe a tap point at the inputs of the second level multiplexers:

L2 (52): the tap point is (V_A=0, V_B=0); number of fields is 2, from LUT tree to L2 go to the 0-input leg of the first level multiplexer, then 0-input leg of the second level multiplexer. If the tap point is the 0 input of multiplexer 16, then tap point is (V_A=1, V_B=0).

Given a tap point, e.g., (V_A, V_B, V_C), then the adder can perform: Add (f(D, ... ), g(A, B, C, D, ... ), CI), where:

f(D, ... ) is any function of (D, ... );

g(A, B, C, D, ... ) is any function of the LUT inputs (A, B, C, D, ... ) such that when A=V_A, B=V_B, C=V_C, g=0.

Four of the possible useful locations for the tap are labeled L1 (reference numeral 48), L1' (reference numeral 50), L2 (reference numeral 52), and L3 (reference numeral 54) in FIG. 4A.

Figure 4B:
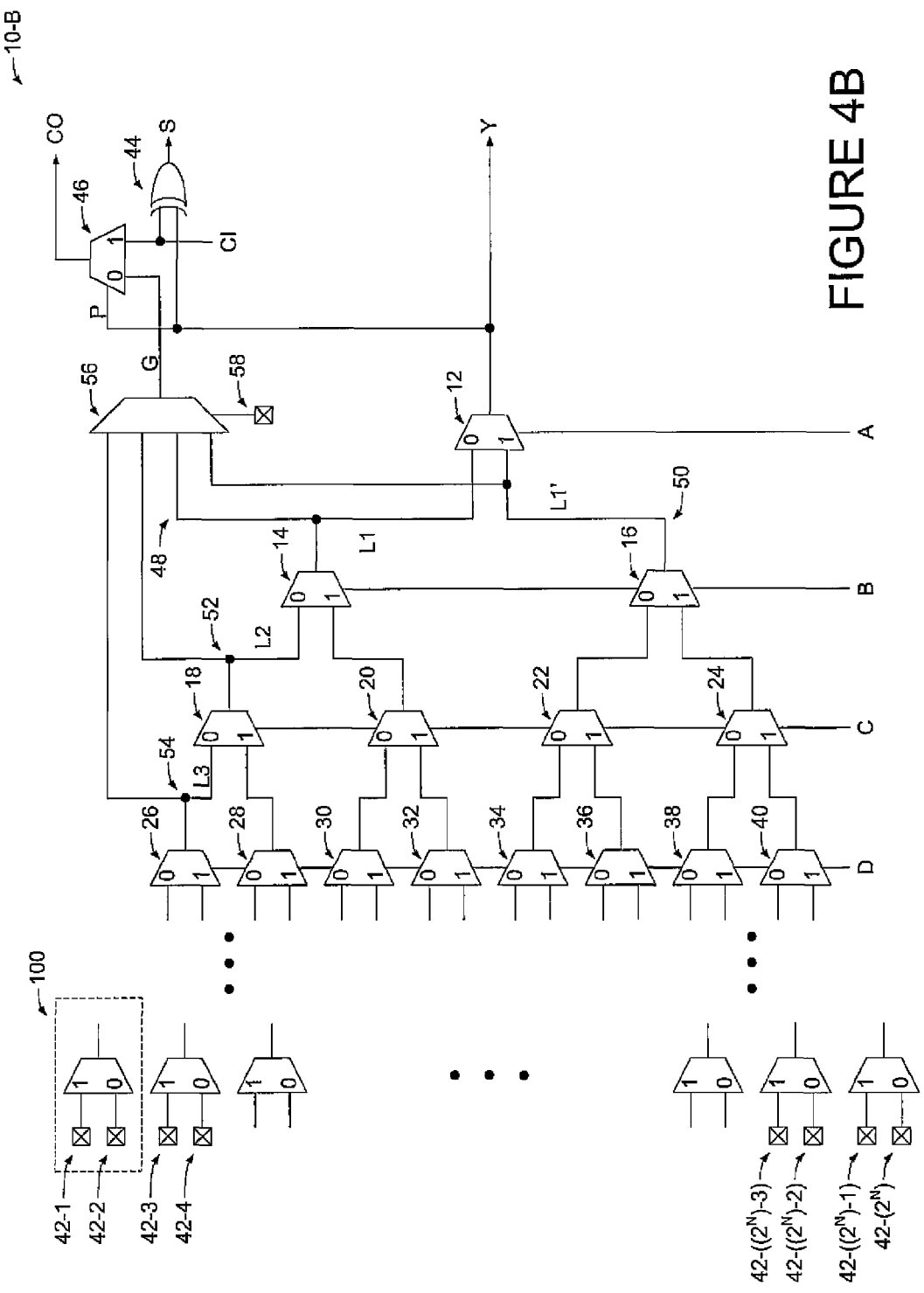
FIG. 4B is a block diagram showing another logic module employing an adder circuit according to the present invention.
Figure 5:
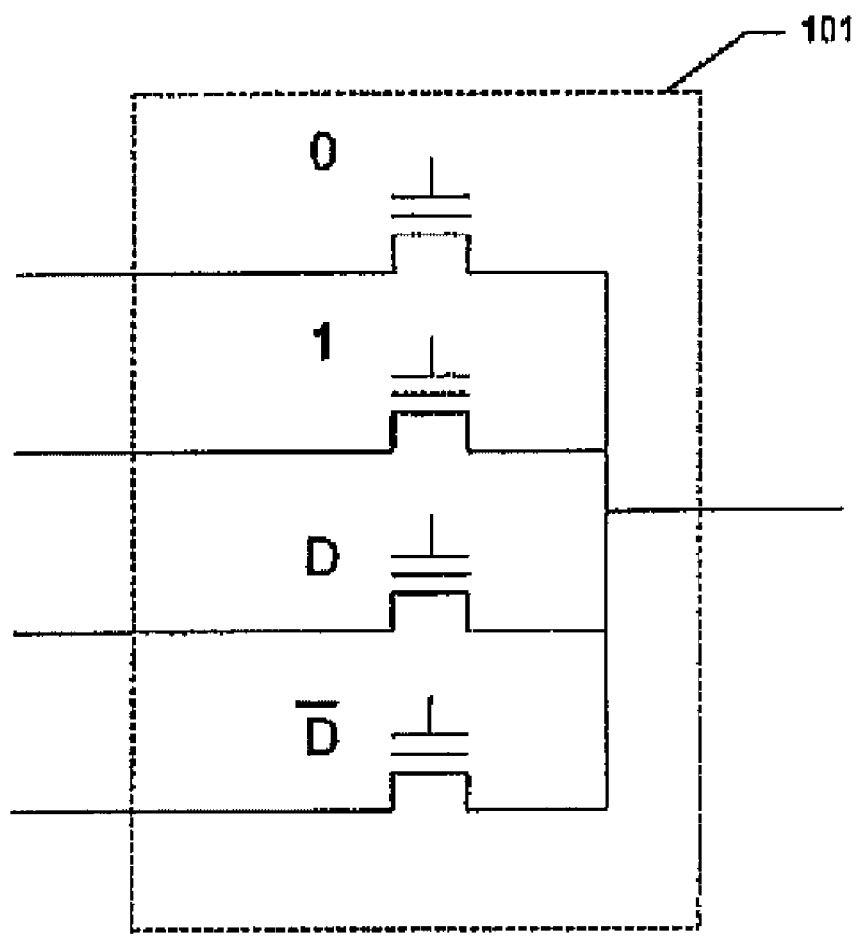
FIG. 5 is a circuit diagram showing a non-volatile configuration memory cell.

Turning now to FIG. 4B, logic module 10-B illustrates an embodiment which makes selectable use of multiple tap points. Here multiplexer 56 has an output node coupled to the 0 input of carry multiplexer 46 (the G signal) and four input nodes coupled to the L1, L1', L2 and L3 nodes. The data input to be gated to the output of multiplexer 56 is selected by one or more memory cells indicated by reference number 58.

Figure 4C:
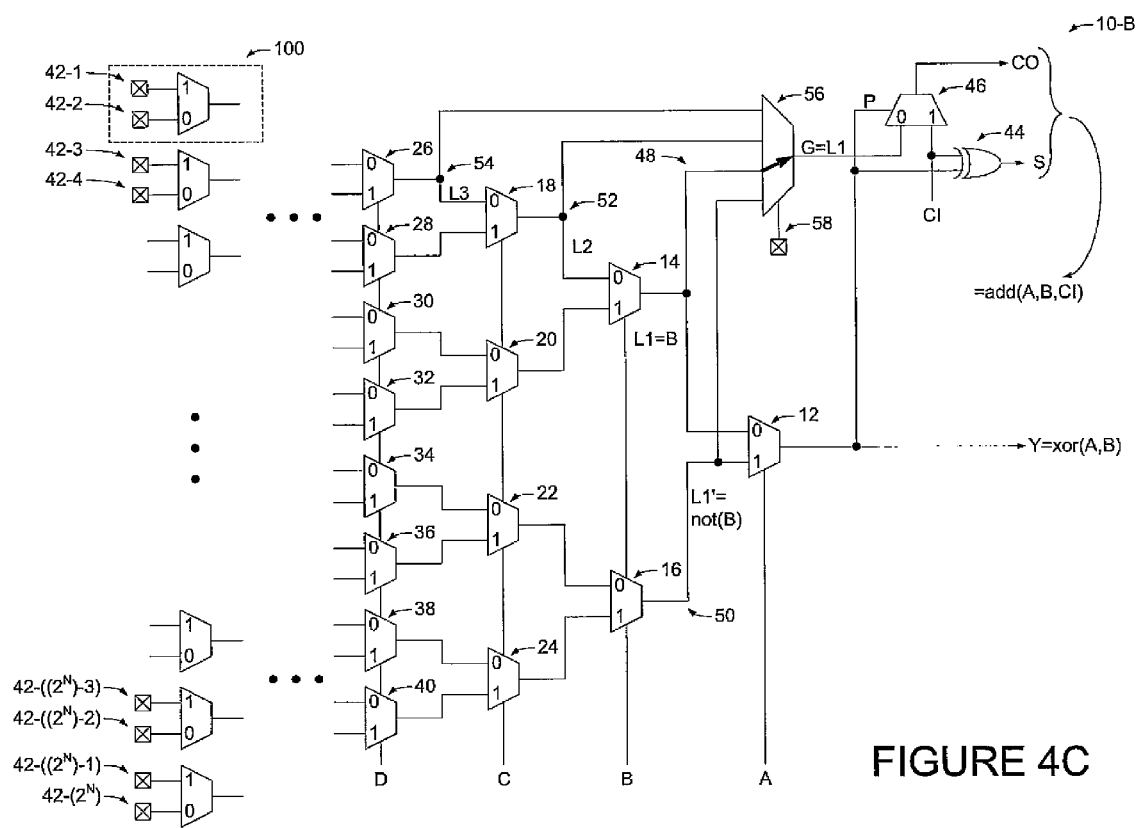
FIG. 4C is a block diagram showing one possible use of the logic module of FIG. 4B employing an adder circuit according to the present invention.

One possible use of logic module 10-B is shown in FIG. 4C. The L1 signal is tapped to be connected the input G (as indicated by the heavy arrow superimposed on multiplexer 56), such that G=L1 the function add(A,B,CI) may be computed by programming the LUT such that:

L1=B

L1'=not(B)

Y=xor(A,B)

Figure 4D:
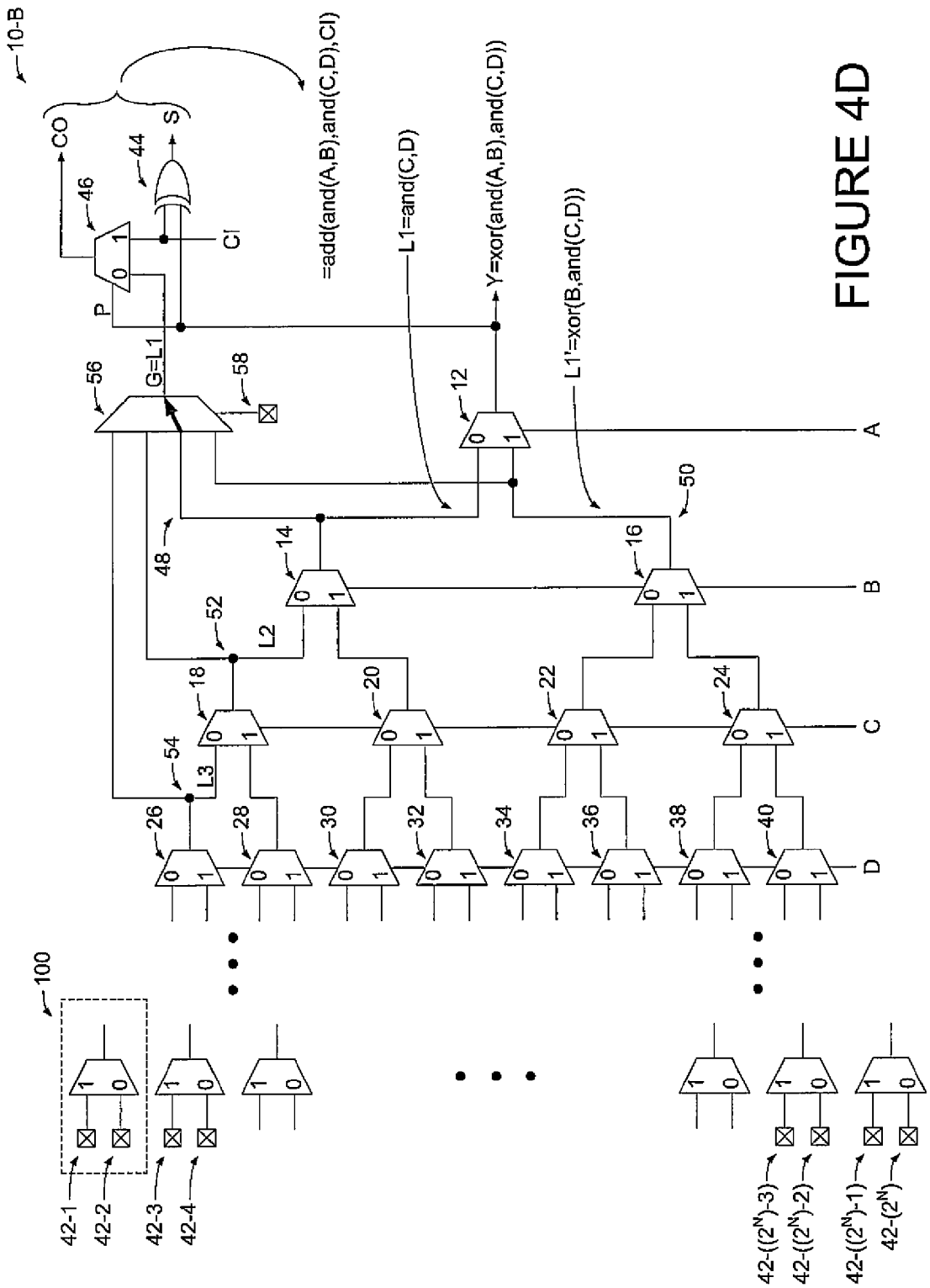
FIG. 4D is a block diagram showing one possible use of the logic module of FIG. 4B employing an adder circuit according to the present invention.

A more complex example using logic module 10-B according to the present invention is shown in FIG. 4D where the function add(and(A,B),and(C,D),CI) is implemented. The L1 signal is tapped (as indicated by the heavy arrow superimposed on multiplexer 56) and the LUT is programmed such that:

L1=and(C,D)

L1'=xor(B,and(C,D))

Y=xor(and(A,B), and(C,D))

Figure 4E:
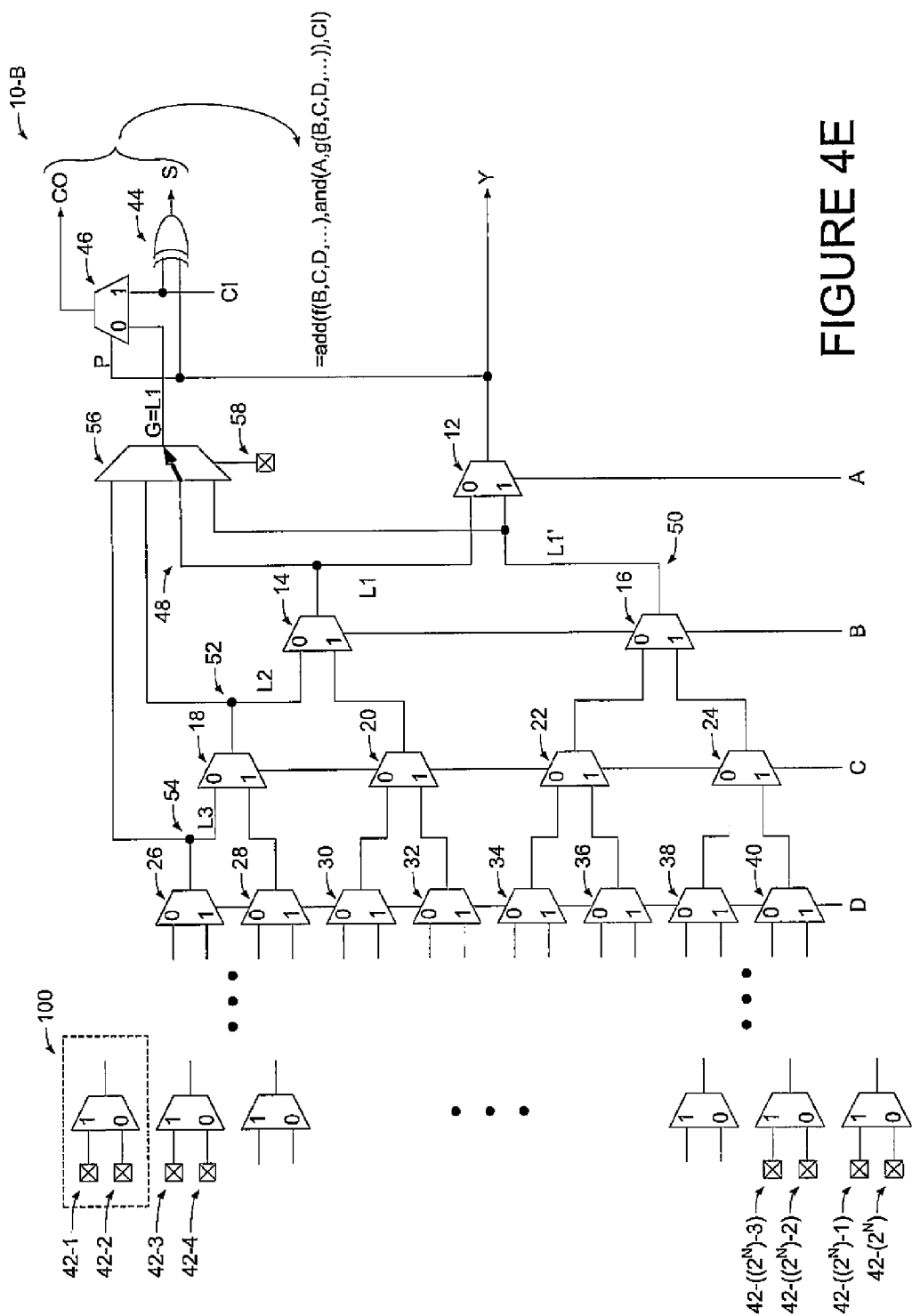
FIG. 4E is a block diagram showing one possible use of the logic module of FIG. 4B employing an adder circuit according to the present invention.

A more general use is shown in FIG. 4E. If multiplexer 56 is configured so that G=L1, this circuit can compute add(f(B, C, D, . . . ), and(A,g(B, C, D, . . . )), CI), where f and g are any boolean functions of all the LUT inputs other than A.

Figure 4F:
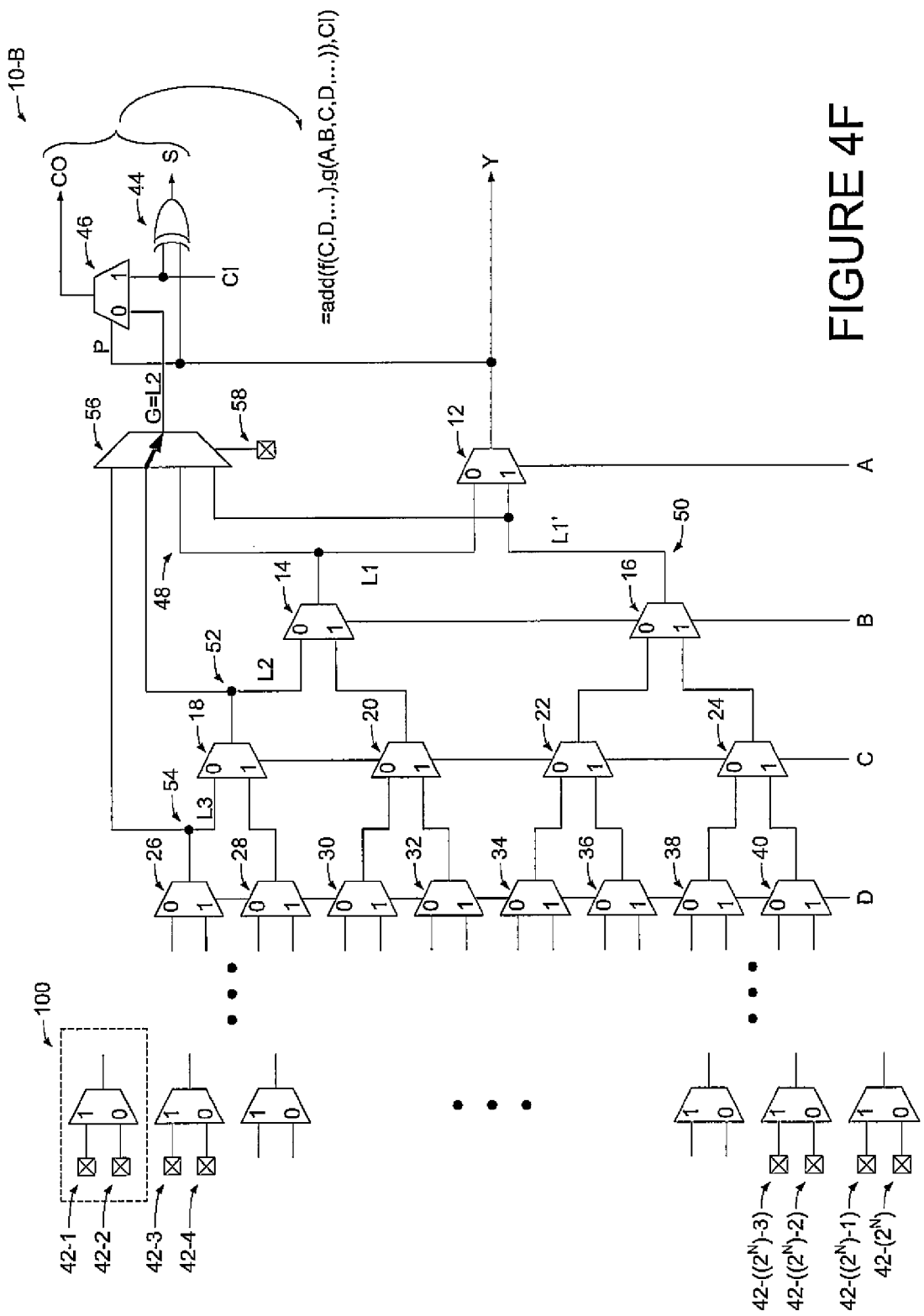
FIG. 4F is a block diagram showing one possible use of the logic module of FIG. 4B employing an adder circuit according to the present invention.

Another use where L2 is the tap point is shown in FIG. 4F. If multiplexer 56 is configured so that G=L2, this circuit can compute add(f(C, D, . . . ), g(A, B, C, D, . . . ), CI), where f is any function of C, D, . . . , and g may be any function of the LUT inputs such that when A=B=0, g=0.

Figure 4G:
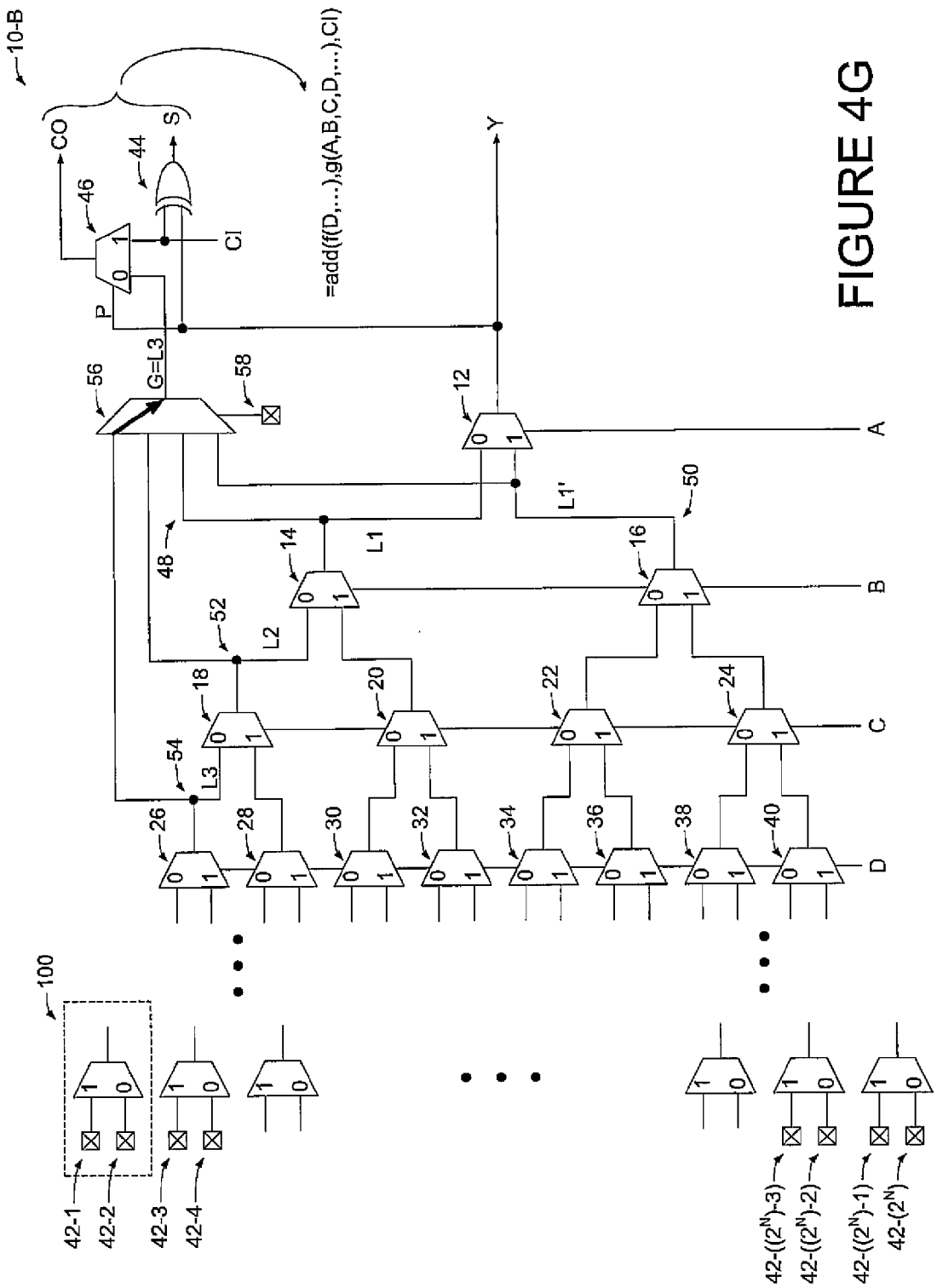
FIG. 4G is a block diagram showing one possible use of the logic module of FIG. 4B employing an adder circuit according to the present invention.

A use where L3 is the tap point is shown in FIG. 4G. If multiplexer 56 is configured so that G=L3, this circuit can compute add(f(D, . . . ), g(A, B, C, D, . . . ), CI) where f is any function of (D, . . . ), and g may be any function of the LUT inputs such that when A=B=C=0, g=0

Figure 4H:
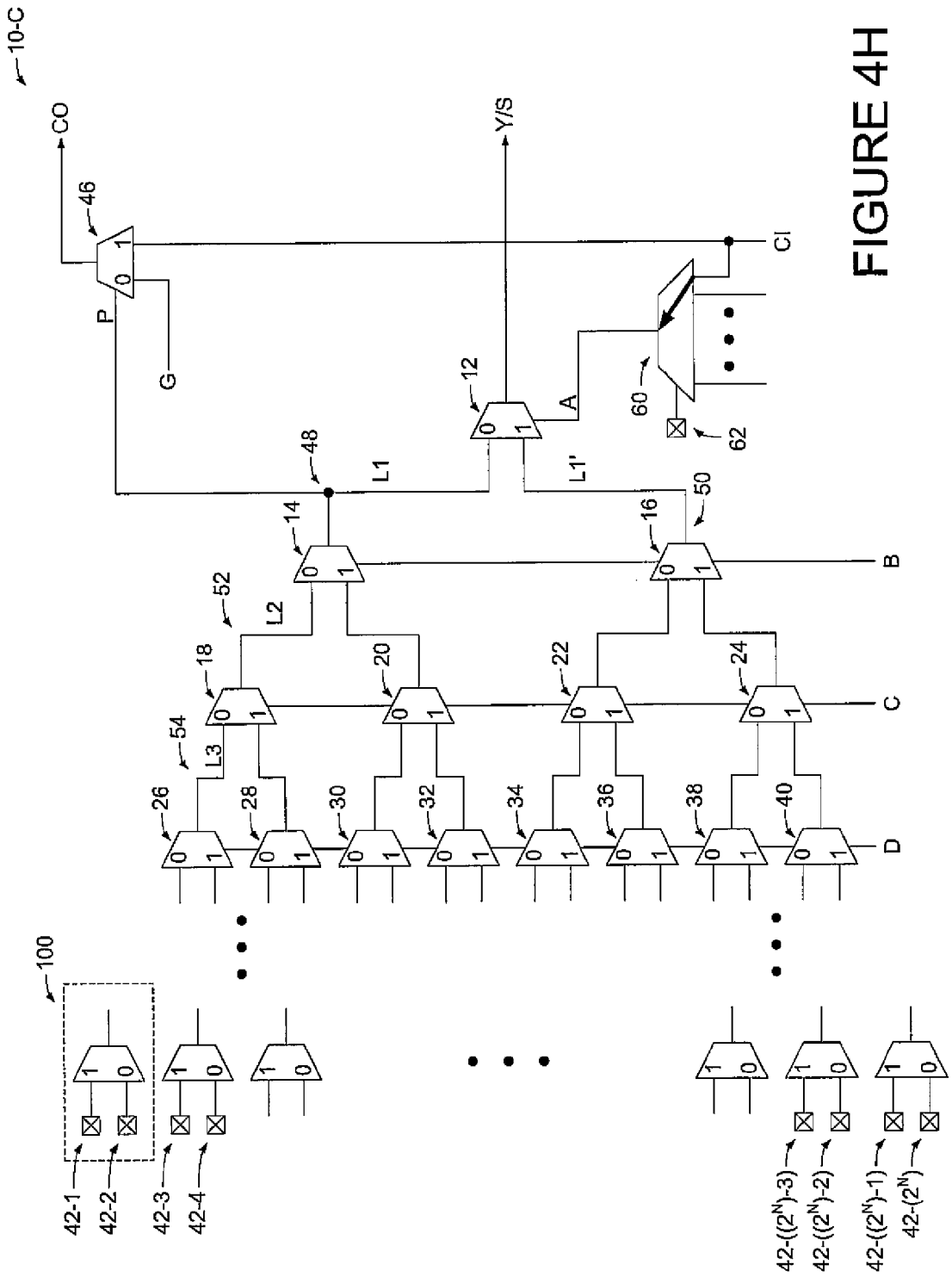
FIG. 4H is a block diagram showing another logic module employing an adder circuit according to the present invention.

There are other variations and extensions of the present invention that may be used singly or in combination. One such variation may be understood with reference to FIG. 4H illustrating logic module 10-C to which attention is now drawn. If N is large enough (N≧3 would be adequate, but N≧5 is preferable), the XOR gate 44 of FIG. 4A may be eliminated. The select input P of carry multiplexer 46 is driven by an input to multiplexer 12, and the G input to carry multiplexer 46 may be driven by L2 or L3, etc. In arithmetic mode, the carry input CI is connected to the A input through multiplexer 60 controlled by one or more memory cells indicated by reference number 62. Multiplexer 60 already exists in the routing structure of the FPGA to select the source of the A term, and is simply provided with another data input to supply the CI input to the select input of multiplexer 12. The speed of this connection is not critical to the carry propagation. Without a need for the XOR gate, the Y and S outputs become identical.

Figure 4I:
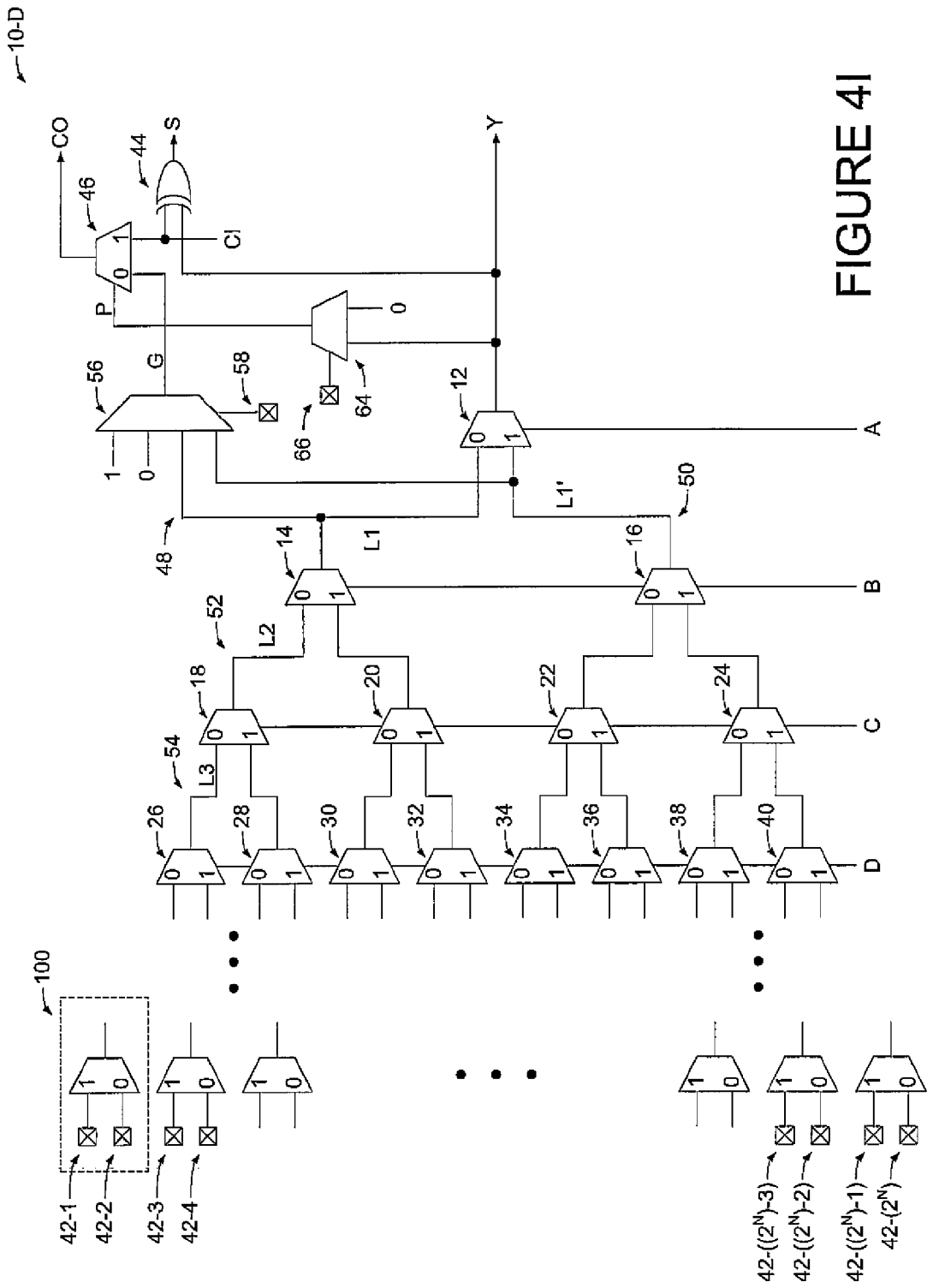
FIG. 4I is a block diagram showing another logic module employing an adder circuit according to the present invention.

FIG. 4I shows an embodiment of a logic module 10-D according to the present invention that incorporates two other features of the present invention. A total of four inputs is most economical for performing arithmetic functions. While more than four inputs may be used as illustrated in the figure as a matter of design choice, further discussion of this figure will assume a total of four inputs (A, B, C and D). As shown in FIG. 4I, L1 (reference numeral 48) and L1' (reference numeral 50) are the outputs of two 3-input LUTs (the L1 LUT-3 comprising 2:1 multiplexers 14, 18, 20, 26, 28, 30 and 32 and the L1' multiplexer comprising 2:1 multiplexers 16, 22, 24, 34, 36, 38 and 40) which can be configured to compute any function of their inputs. These two 3-input LUTs and the 2:1 multiplexer 12 controlled by the "A" input together comprise a 4-input LUT. Multiplexer 56, under control of FPGA configuration circuitry 58, can select a logic "0," a logic "1," L1 or L1' as the source of the G signal.

When not used for arithmetic purposes (normal mode) the output of the 4-input LUT comprising 2:1 multiplexers 12, 14, 16, 18, 20, 22, 24, 26, 28, 30, 32, 34, 36, 38 and 40 is brought out as Y. In arithmetic mode, S is the sum generated from "Y" and "CI" in XOR gate 44. A multiplexer 64 whose select input is driven by FPGA configuration circuitry 66, provides either the "Y" output of the 4-input LUT or a logic "0" as the "P" select input to carry multiplexer 46, and CO is the carry output to the next logic module in the chain. Y and S may optionally be combined in subsequent logic, or selected between using subsequent configuration multiplexers.

By providing that FPGA configuration circuitry allows a choice of 0, 1 or the tap location as the source of G and also a choice of 0 or Y as the source of P, a way is provided to force CI of the subsequent stage in the carry chain to a known value, which is useful to initialize the carry input of the least-significant bit. In addition, provision may be made to allow G to be selected from the taps L1 or L2 or from L1 or L1' as in FIG. 4B and FIG. 4I, respectively, under control of configuration memory. Such multiple taps increase the flexibility of the circuit with a small amount of additional hardware.

The present invention provides several advantages. Rapid carry propagation reduces need for additional carry look-ahead circuitry, although the present invention could be used with carry look-ahead circuitry for even faster speeds if desired. In addition, arithmetic is supported with very little additional circuitry beyond the basic 4-input LUT. Any subset of inputs A, B, C, and D may be inverted. Inputs B, C, and D can be inverted by appropriately altering the configuration of the L1 and L1' 3-input LUTs of FIG. 4I. Input A may be inverted by swapping the configurations of L1 and L1', and swapping which of these is selected to produce signal G. The logic module of the present invention retains complete interchangeability of B, C, and D even in arithmetic mode. Further, the embodiment shown in FIG. 4I can implement all functions shown in Table 1 below using a carry chain, while other embodiments may implement all, or a subset of these functions. Table 1 below uses the nomenclature of C++ programming to indicate arithmetic and other functions.

TABLE 1

| Name | Function (C expression treating variables as bit vectors) | Bitwise Function (boolean expression) Y[j] or SUM[j] | CO[j] | CI[0] | Mapping A | Mapping B/C/D | Values of Internal Signals L1 | L1' | G |
|---|---|---|---|---|---|---|---|---|---|
| Adder | U + V | xor(u, v, ci) | maj(u, v, ci) | 0 | u | v | v | not(v) | L1 |
|  |  |  |  |  | v | u | u | not(u) | L1 |
| subtractor | U − V | xnor(u, v, ci) | maj(u, not(v), ci) | 1 | 1 | u, v | not(v) | v | L1 |
|  |  |  |  |  | u | v | not(u) | u | L1' |
|  |  |  |  |  | v | u |  | xnor(u, v) |  |
| adder/subtractor | SUB ? U − V:U + V | xor(u, v, ci, SUB) | maj(u, xor(v, SUB), ci) | SUB | u | v, SUB | u | xnor(SUB, v) | L1 |
|  |  |  |  |  | 1 | u, v, SUB | xor(SUB, v) | xor(SUB, u, v) | L1 |
| loadable adder | SL ? SD:U + V | SL?sd:xnor(u, v, ci) | SL?0:maj(u, v, ci) | 0 | u | v, sd, SL | SL?sd:v | SL?sd:not(v) | L1 |
| loadable subtractor | SL ? SD:U − V | SL?sd:xnor(u, v, ci) | SL?0:maj(u, not(v), ci) | not(SL) | u | v, sd, SL | SL?sd:v | SL?sd:not(u) | L1 |
|  |  |  |  |  | v | u, sd, SL | SL?sd:u | SL?sd:v | L1' |
| loadable up counter (V is fixed) | SL ? SD:U + V | SL?SD:xnor(u, v, ci) | SL?0:maj(u, v, ci) | 0 | 1 | sd, SL | SL?sd:v | SL?sd:not(v) | L1 |
| loadable down counter (V is fixed) | SL ? SD:U − V | SL?SD:xnor(u, v, ci) | SL?0:maj(u, not(v), ci) | not(SL) | 1 | sd, SL | and(u, not(SL)) | SL?sd:xor(u, v) | L1 |
| loadable up/down counter (V is fixed) | SL ? SD:(SUB ? U−V:U+V) | SL?SD:xor(u, v, ci, SUB) | and(not(SL), SUB) | u | sd, SL, SUB | SL?sd:xor(SUB, v) | SL?sd:xnor(SUB, v) | L1 |
|  |  |  |  |  | SUB | u, sd, SL | SL?sd:xnor(u, v) | SL?sd:xnor(u, v) | v?L1':L1 |
| loadable up accumulator | SL ? V:U + V | SL?v:xor(u, v, ci) | SL?0:maj(u, v, ci) | 0 | u | v, SL | v | SL?v:not(v) | L1 |
|  |  |  |  |  | v | u, SL | SL?0:u | SL?1:not(u) | L1 |
|  |  |  |  |  | SL | u, v | xor(u, v) | v | L1' |
| loadable down accumulator | SL ? V:U − V | SL?v:xnor(u, v, ci) | SL?0:maj(u, not(v), ci) | not(SL) | 1 | v, SL | SL?0:u | SL?v:xor(u, v) | L1 |
| loadable up/down accum | SL ? V:(SUB ? U − V:U + V) | SL?v:xor(u, v, ci, SUB) | SL?0:maj(u, xor(v, SUB), ci) | and(not(SL), SUB) | u | v, SUB, SL | SL?v:xor(SUB, v) | SL?v:xnor(SUB, v) | L1 |
| Mux Add | U + (S ? V:W) | xor(u, ci, S?v:w) | maj(u, ci, S?v:w) | 0 | u | v, w, S | S?v:w | not(S?v:w) | L1 |
| Mult Add 1 | (U&V) + W | xor(and(u, v), w, ci) | maj(and(u, v), w, ci) | 0 | u | v, w | w | xor(w, v) | L1 |
|  |  |  |  |  | v | u, w | w | xor(w, u) | L1 |
|  |  |  |  |  | w | u, v | and(u, v) | nand(u, v) | L1 |
| Mult Add 2 | (U&V) + (W&X) | xor(and(u, v), and(w, x), ci) | maj(and(u, v), and(w, x), ci) | 0 | u | v, w, x | and(w, x) | xor(and(w, x), v) | L1 |
| Wide AND of F4 | f(U[0], V[0], W[0], X[0]) && f(U[1], V[1], W[1], X[1]) && ... | N/A | and(f(u, v, w, x), ci) | 1 | u | v, w, x | f(0, v, w, x) | f(1, v, w, x) | 0 |
|  |  |  |  |  | v | u, w, x | f(0, u, w, x) | f(1, u, w, x) | 0 |
|  |  |  |  |  | w | u, v, x | f(0, u, v, x) | f(1, u, v, x) | 0 |
|  |  |  |  |  | x | u, v, w | f(0, u, v, w) | f(1, u, v, w) | 0 |
| Wide OR of F4 | f(U[0], V[0], W[0], X[0]) \|\| f(U[1], V[1], W[1], X[1]) \|\| ... | N/A | or(f(u, v, w, x), ci) | 0 | u | v, w, x | not(f(0, v, w, x)) | not(f(1, v, w, x)) | 1 |
|  |  |  |  |  | v | u, w, x | not(f(0, u, w, x)) | not(f(1, u, w, x)) | 1 |
|  |  |  |  |  | w | u, v, x | not(f(0, u, v, x)) | not(f(1, u, v, x)) | 1 |
|  |  |  |  |  | x | u, v, w | not(f(0, u, v, w)) | not(f(1, u, v, w)) | 1 |

Figure 1:
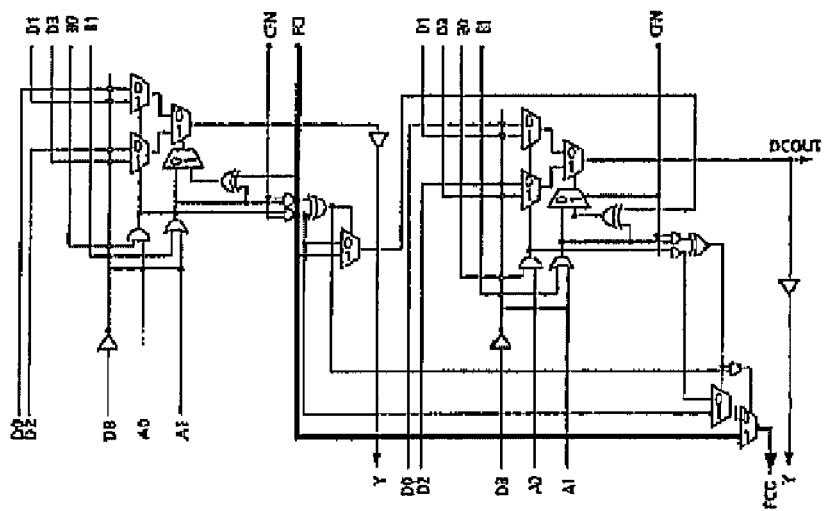
FIG. 1 is a block diagram showing a prior-art carry chain that uses a 2-bit look-ahead scheme, and two dedicated XOR gates per bit.
Figure 2:
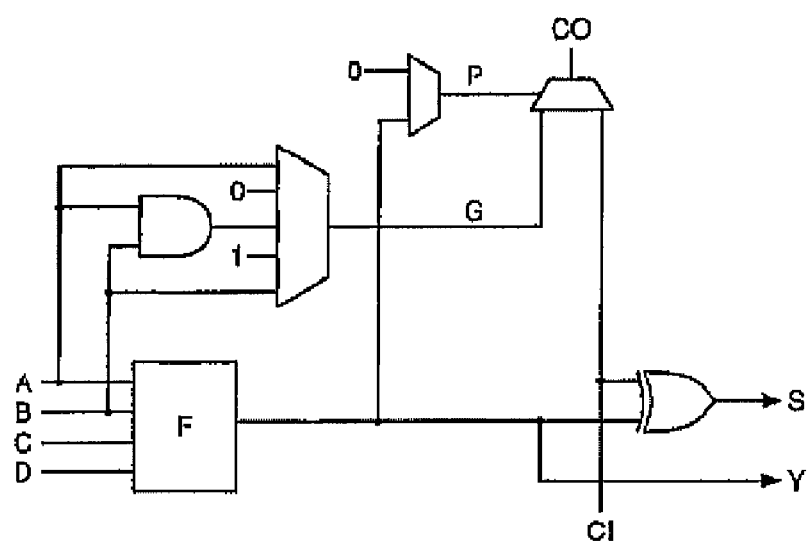
FIG. 2 is a block diagram showing a logic module using another adder scheme from the prior art.
Figure 3:
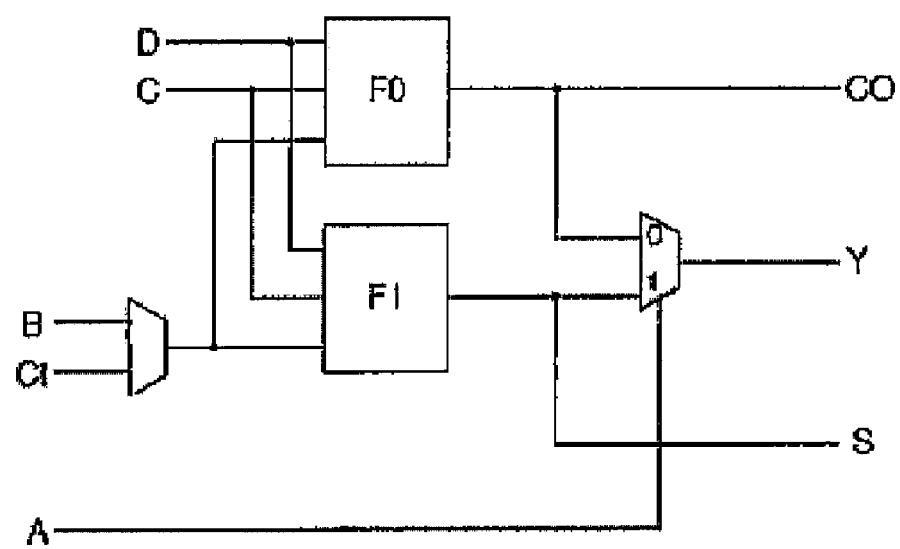
FIG. 3 is a block diagram showing another prior-art logic module using an adder scheme.

Returning to FIG. 4B, an internal signal from the LUT (e.g. L1, L1', L2, L3) is tapped to provide a possible input (e.g. G) to the multiplexer generating the carry output. A configurable choice of more than one internal signal may be tapped for this purpose. The final stage of the LUT can be used to implement the XOR function generating the sum output as in the embodiment shown in FIG. 4H, eliminating the need for a dedicated XOR gate as in the prior art configuration shown in FIGS. 1 and 2. The connection from CI to the last stage of the LUT (e.g. to A input in FIG. 4H) can be added to the normal routing multiplexer generating the input since this path is not critical to the speed of the carry chain. The techniques of the present invention can be used with LUTs having more than 4 inputs. The taps can be chosen to allow programmable inversion of LUT inputs as in the embodiment of FIG. 4I.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A logic module including:
N data inputs;
a carry input;
a logic output;
a sum output;
a carry output;
a group of $2^N$ configuration memory cells, each configuration memory cell having an output;
an N-input LUT formed from an N-level tree of 2:1 multiplexers, each multiplexer in a level of the tree having multiplexer select inputs coupled together to a unique one of the N data inputs and having first and second multiplexer data inputs and a multiplexer output, the first and second multiplexer data inputs in each level of the tree being connected in a tree structure to multiplexer outputs of the next higher level of the tree, the first and second multiplexer data inputs of each of the multiplexers in the Nth level of the tree being connected to the output of a different one of the configuration memory cells, and the output of the multiplexer in the first level of the tree being coupled to the logic output;
a carry multiplexer having a first data input coupled to the carry input, a second data input coupled to a first multiplexer output internal to the N-input LUT, a select input coupled to the logic output, and an output coupled to the carry output; and
an XOR gate having a first input coupled to the logic output, a second input coupled to the carry input, and an output coupled to the sum output.

2. The logic module of claim 1, wherein:
the second data input of the carry multiplexer is coupled to the first multiplexer output internal to the N-input LUT via a tapping multiplexer.

3. The logic module of claim 2, wherein:
the tapping multiplexer has at least two data inputs, at least one select input, and an output, wherein at least one data input is coupled to the first member of the subset of the multiplexer outputs internal to the N-input LUT; and the select input is coupled to a source of configuration data.

4. The logic module of claim 3, wherein:
at least one data input of the tapping multiplexer is coupled to a constant.

5. The logic module of claim 3, wherein:
the tapping multiplexer has at least two data inputs coupled to constants.

6. The logic module of claim 3, wherein:
at least one data input of the tapping multiplexer is coupled to a second member of the subset of the multiplexer outputs internal to the N-input LUT.

7. A logic module including:
at least four data input nodes, a carry-in input, a logic output, a sum output, and a carry output;
a first LUT having at least first, second, and third data inputs and an output, the first data input coupled to a first one of the data input nodes, the second data input coupled to a second one of the data input nodes, the third data input coupled to a third one of the data input nodes;
a second LUT having at least first, second, and third data inputs and an output, the first data input coupled to the first one of the data input nodes, the second data input coupled to the second one of the data input nodes, the third data input coupled to the third one of the data input nodes;
a first multiplexer having a data input coupled to the output of the first LUT, a second data input coupled to the output of the second LUT, a select input coupled to a fourth one of the data input nodes, and an output coupled to the logic output;
a second multiplexer having a first data input coupled to the output of the first LUT, a second data input coupled to the output of the second LUT, a third data input coupled to a logic zero term, a fourth data input coupled to a logic one term, a select input coupled to a source of configuration data, and an output;
a third multiplexer having a first data input coupled to the output of the first multiplexer, a second data input coupled to a logic zero term, a select input coupled to a source of configuration data, and an output;
a carry multiplexer having a first data input coupled to the carry-in input, a second data input coupled to the output of the second multiplexer, a select input coupled to the output of the third multiplexer and an output coupled to the carry output; and
an XOR gate having a first input coupled to the output of the first multiplexer, a second input coupled to the carry-in input, and an output coupled to the sum output.

8. A logic module including: N data inputs; a carry input; a logic output; a sum output; a carry output; a group of 2N configuration memory cells, each configuration memory cell having an output; an N-input LUT formed from an N-level tree of 2:1 multiplexers, each multiplexer in a level of the tree having select inputs coupled together to a unique one of the N data inputs and having first and second data inputs and an output, the first and second data inputs of the multiplexers in each level of the tree being connected in a tree structure to outputs of the multiplexers of the next higher level of the tree, the first and second data inputs of each of the multiplexers in the Nth level of the tree being connected to the output of a different one of the configuration memory cells, the output of the multiplexer in the first level of the tree being coupled to the logic output; a carry multiplexer having a first data input coupled to the carry input, a second data input coupled to a tap node, a select input coupled to the output of the multiplexer in the first level of the tree, and an output coupled to the carry output; an XOR gate having a first input coupled to the output of the multiplexer in the first level of the tree, a second input coupled to the carry input, and an output coupled to the sum output; and wherein the tap node is coupled to the data output of one of the multiplexers in a level of the tree other than the first level.

9. The logic module of claim 8 wherein each configuration memory cell is adapted to receive four inputs and to send one output.

10. The logic module of claim 9 wherein each configuration memory cell is further comprised of four non-volatile transistors, each non-volatile transistor having a first terminal coupled to one of said four inputs and a second terminal coupled to the cell output.

* * * * *